(12) United States Patent
Cheng et al.

(10) Patent No.: US 12,191,208 B2
(45) Date of Patent: Jan. 7, 2025

(54) DUAL STRAINED SEMICONDUCTOR SUBSTRATE AND PATTERNING

(71) Applicant: International Business Machines Corporation, Armonk, NY (US)

(72) Inventors: Kangguo Cheng, Schenectady, NY (US); Shogo Mochizuki, Mechanicville, NY (US); Juntao Li, Cohoes, NY (US)

(73) Assignee: International Business Machines Corporation, Armonk, NY (US)

( * ) Notice: Subject to any disclaimer, the term of this patent is extended or adjusted under 35 U.S.C. 154(b) by 561 days.

(21) Appl. No.: 17/482,573

(22) Filed: Sep. 23, 2021

(65) Prior Publication Data

US 2023/0086888 A1    Mar. 23, 2023

(51) Int. Cl.
*H01L 27/12*     (2006.01)
*H01L 21/8238*   (2006.01)
*H01L 21/84*     (2006.01)
*H01L 27/092*    (2006.01)

(52) U.S. Cl.
CPC ...... *H01L 21/823807* (2013.01); *H01L 21/84* (2013.01); *H01L 27/092* (2013.01); *H01L 27/1203* (2013.01)

(58) Field of Classification Search
CPC ... H01L 29/165; H01L 29/161; H01L 29/517; H01L 29/4966; H01L 21/823842
See application file for complete search history.

(56) References Cited

U.S. PATENT DOCUMENTS

| | | | |
|---|---|---|---|
| 6,310,367 B1 | 10/2001 | Yagishita |
| 7,977,706 B2 | 7/2011 | Lochtefeld |
| 9,318,491 B2 | 4/2016 | Cantoro |
| 9,472,555 B1 | 10/2016 | Balakrishnan |
| 9,583,491 B2 | 2/2017 | Kim |
| 9,711,414 B2 | 7/2017 | Hatcher |
| 9,871,140 B1 | 1/2018 | Balakrishnan |
| 9,887,197 B2 | 2/2018 | Balakrishnan |
| 9,917,015 B2 | 3/2018 | Cheng |
| 10,283,625 B2 | 5/2019 | Cheng |
| 10,332,803 B1 | 6/2019 | Xie |
| 10,347,657 B1 | 7/2019 | Leobandung |
| 10,381,438 B2 | 8/2019 | Zhang |
| 10,483,166 B1 | 11/2019 | Cheng |
| 10,741,456 B2 | 8/2020 | Cheng |
| 10,892,331 B2 | 1/2021 | Yamashita |

(Continued)

FOREIGN PATENT DOCUMENTS

CN    101710584 B    5/2011
CN    104126222 B    6/2017

(Continued)

OTHER PUBLICATIONS

Cheng et al; "Forming Stacked Nanosheet Semiconductor Devices With Optimal Crystalline Orientations Around Devices ", U.S. Appl. No. 17/481,353, filed Sep. 22, 2021, 41 Pgs.

(Continued)

*Primary Examiner* — Elias Ullah
(74) *Attorney, Agent, or Firm* — Heather Johnston (57) ABSTRACT

A dielectric layer is on top of a first semiconductor stack. The first semiconductor stack is compressively strained. A second semiconductor stack is on top of the dielectric layer. The second semiconductor stack is tensely strained.

10 Claims, 10 Drawing Sheets

(56) References Cited

U.S. PATENT DOCUMENTS

| | | | |
|---|---|---|---|
| 10,930,563 | B2 | 2/2021 | Cheng |
| 10,991,626 | B2 | 4/2021 | Smith |
| 11,018,235 | B2 | 5/2021 | Huynh Bao |
| 2015/0263088 | A1 | 9/2015 | Cheng |
| 2019/0131394 | A1 | 5/2019 | Reznicek |
| 2020/0091287 | A1 | 3/2020 | Glass |
| 2020/0105750 | A1 | 4/2020 | Xiao |
| 2020/0118891 | A1* | 4/2020 | Cheng ............ H01L 27/1203 |
| 2020/0119015 | A1 | 4/2020 | Bi |
| 2020/0219879 | A1 | 7/2020 | Shin |
| 2020/0294866 | A1 | 9/2020 | Cheng |
| 2021/0104523 | A1 | 4/2021 | Fulford |
| 2021/0202326 | A1 | 7/2021 | Schwarzenbach |
| 2021/0265508 | A1 | 8/2021 | Chiang |

FOREIGN PATENT DOCUMENTS

| | | | |
|---|---|---|---|
| CN | 107492552 | A | 12/2017 |
| CN | 106365106 | B | 9/2018 |
| CN | 106463543 | B | 4/2020 |
| CN | 111566803 | A | 8/2020 |
| JP | 2005268438 | A | 9/2005 |
| KR | 101374485 | B1 | 3/2014 |
| KR | 20160047409 | A | 5/2016 |

OTHER PUBLICATIONS

IBM Appendix P., "List of IBM Patents or Patent Applications to be Treated as Related", Dated Herewith, 2 pages.

"Notification of Transmittal of the International Search Report and the Written Opinion of the International Searching Authority,Or the Declaration", From the International Searching Authority, Applicant's or agent's file reference: PF220657PCT, International application No. PCT/CN2022/120113, Date of mailing: Dec. 16, 2022, International filing date: Sep. 21, 2022, 10 pgs.

J. Ryckaert et al., "The Complementary FET (CFET) for CMOS scaling beyond N3," Symposium on VLSI Technology, 2018, 978-1-5386-4218-4 © 2018 IEEE , 2 Pgs.

"Patent Cooperation Treaty PCT Notification of Transmittal of the International Search Report and the Written Opinion of the International Searching Authority, or the Declaration", International application No. PCT/CN2022/120119, International filing date Sep. 21, 2022 (Sep. 21, 2022), Date of Mailing Dec. 15, 2022 (Dec. 15, 2022), 10 pages.

* cited by examiner

DUAL STRAINED SEMICONDUCTOR SUBSTRATE AND PATTERNING

BACKGROUND OF THE INVENTION

The present invention relates generally to the field of semiconductor device manufacture and more particularly to dual strain semiconductor substrates and patterning.

Semiconductor devices are fabricated by sequentially depositing insulating (dielectric) layers, conductive layers, and semiconductor layers of material over a semiconductor substrate, and patterning the various layers using lithography to form circuit components and elements thereon. Generally, these semiconductor devices include a plurality of circuits which form an integrated circuit (IC) fabricated on a semiconductor substrate.

SUMMARY

Embodiments of the present invention provide for a semiconductor structure. In an embodiment, a dielectric layer is on top of a first semiconductor stack. The first semiconductor stack is compressively strained. A second semiconductor stack is on top of the dielectric layer. The second semiconductor stack is tensely strained.

Embodiments of the present invention provide for a semiconductor structure. In an embodiment, a first silicon germanium (SiGe) layer is on top of and in contact with a substrate. A first liner layer is on top of and in contact with the first SiGe layer. A first dielectric layer is on top of an in contact with the first liner layer. A second liner layer is on top of and in contact with the first dielectric layer. A second dielectric layer is on top of and in contact with the second liner layer. A second silicon germanium (SiGe) layer is on top of an in contact with the second dielectric layer.

Embodiments of the present invention provide a method for forming a semiconductor structure. A first silicon germanium (SiGe) layer is epitaxially grown on top of a substrate. A second silicon germanium (SiGe) layer is epitaxially grown on top of the first SiGe layer. A third silicon germanium (SiGe) layer is epitaxially grown on top of the second SiGe layer. A hardmask layer is deposited on top of the third SiGe layer. The second SiGe layer is selectively undercut relative to the first SiGe layer, the third SiGe layer, and the substrate. A liner layer is deposited upon an exposed portion of the substrate, the first SiGe layer, the second SiGe layer, the third SiGe layer, and the hardmask layer. A first dielectric layer is deposited on top of the substrate around and in contact with the liner layer.

BRIEF DESCRIPTION OF THE DRAWINGS

The above and other aspects, features, and advantages of various embodiments of the present invention will be more apparent from the following description taken in conjunction with the accompanying drawings.

DETAILED DESCRIPTION

Embodiments of the present invention recognize that a stacked complementary metal-oxide-semiconductor (CMOS) increases transistor density by stacking N-channel field effect transistor (NFET) and P-channel field effect transistor (PFET) on top of each other. Embodiments of the present invention recognize that strain engineering can provide a boost in electron and hole mobility and thus improved the performances of NFET and PFET. Embodiments of the present invention recognize that forming stacked CMOS with mobility enhancement for both NFET and PFET provides an advantage.

Embodiments of the present invention provide a semiconductor structure that comprises one or more compressively strained layers (i.e., SiGe layer) and one or more tensely strained layers (e.g., Si) above the compressively strained layers. Embodiments of the present invention provide for a stacked fin field-effect transistor (FinFET) CMOS structure with a tensely strained Si NFET on top of a compressively strained SiGe PFET. Embodiment of the present invention provide for a stacked nanosheet CMOS structure with tensely strained Si NFET on top of a compressively strained SiGe PFET.

Detailed embodiments of the claimed structures and methods are disclosed herein. The method steps described below do not form a complete process flow for manufacturing integrated circuits, such as, semiconductor devices. The present embodiments can be practiced in conjunction with the integrated circuit fabrication techniques currently used in the art and only so much of the commonly practiced process steps are included as are necessary for an understanding of the described embodiments. The figures represent cross-section portions of a semiconductor structure after fabrication and are not drawn to scale, but instead are drawn to illustrate the features of the described embodiments. Specific structural and functional details disclosed herein are not to be interpreted as limiting, but merely as a representative basis for teaching one skilled in the art to variously employ the methods and structures of the present disclosure. In the description, details of well-known features and techniques may be omitted to avoid unnecessarily obscuring the presented embodiments.

References in the specification to "one embodiment", "other embodiment", "another embodiment", "an embodiment", etc., indicate that the embodiment described may include a particular feature, structure or characteristic, but every embodiment may not necessarily include the particular feature, structure or characteristic. Moreover, such phrases are not necessarily referring to the same embodiment. Further, when a particular feature, structure, or characteristic is described in connection with an embodiment, it is understood that it is within the knowledge of one skilled in the art to affect such feature, structure or characteristic in connection with other embodiments whether or not explicitly described.

For purposes of the description hereinafter, the terms "upper", "lower", "right", "left", "vertical", "horizontal", "top", "bottom", and derivatives thereof shall relate to the disclosed structures and methods, as oriented in the drawing figures. The terms "overlying", "atop", "over", "on", "positioned on" or "positioned atop" mean that a first element is present on a second element wherein intervening elements, such as an interface structure, may be present between the first element and the second element. The term "direct contact" means that a first element and a second element are connected without any intermediary conducting, insulating or semiconductor layers at the interface of the two elements.

In the interest of not obscuring the presentation of the embodiments of the present invention, in the following detailed description, some of the processing steps, materials, or operations that are known in the art may have been combined together for presentation and for illustration purposes and in some instances may not have been described in detail. Additionally, for brevity and maintaining a focus on distinctive features of elements of the present invention, description of previously discussed materials, processes, and structures may not be repeated with regard to subsequent Figures. In other instances, some processing steps or operations that are known may not be described. It should be understood that the following description is rather focused on the distinctive features or elements of the various embodiments of the present invention.

In general, the various processes used to form a semiconductor chip fall into four general categories, namely, film deposition, removal/etching, semiconductor doping, and patterning/lithography. Deposition is any process that grows, coats, or otherwise transfers a material onto the wafer. Available technologies include but are not limited to physical vapor deposition ("PVD"), chemical vapor deposition ("CVD"), electrochemical deposition ("ECD"), molecular beam epitaxy ("MBE") and more recently, atomic layer deposition ("ALD") among others. Another deposition technology is plasma enhanced chemical vapor deposition ("PECVD"), which is a process that uses the energy within the plasma to induce reactions at the wafer surface that would otherwise require higher temperatures associated with conventional CVD. Energetic ion bombardment during PECVD deposition can also improve the film's electrical and mechanical properties.

Semiconductor lithography is the formation of three-dimensional relief images or patterns on the semiconductor substrate for subsequent transfer of the pattern to the substrate. In semiconductor lithography, the patterns are formed by a light sensitive polymer called a photoresist. The pattern created by lithography or photolithography typically are used to define or protect selected surfaces and portions of the semiconductor structure during subsequent etch processes.

Removal is any process such as etching or chemical-mechanical planarization ("CMP") that removes material from the wafer. Examples of etch processes include either wet (e.g., chemical) or dry etch processes. One example of a removal process or dry etch process is ion beam etching ("IBE"). In general, IBE (or milling) refers to a dry plasma etch method that utilizes a remote broad beam ion/plasma source to remove substrate material by physical inert gas and/or chemical reactive gas means. Like other dry plasma etch techniques, IBE has benefits such as etch rate, anisotropy, selectivity, uniformity, aspect ratio, and minimization of substrate damage. Another example of a dry etch process is reactive ion etching ("RIE"). In general, RIE uses chemically reactive plasma to remove material deposited on wafers. High-energy ions from the RIE plasma attack the wafer surface and react with the surface material(s) to remove the surface material(s).

FIGS. 1-9 depict a structure and method of dual strain semiconductor substrates and patterning for forming dual strained stacked CMOS in accordance with an embodiment of the invention.

Figure 1A:
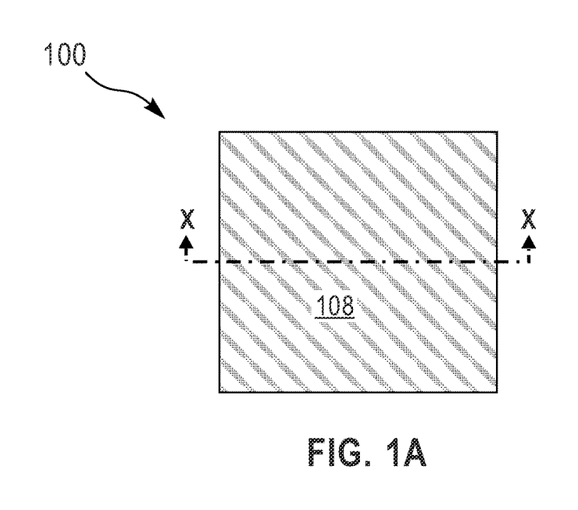
FIG. 1A depicts a top view of a semiconductor structure with epitaxially growing a third silicon germanium (SiGe) layer on top of a second SiGe layer, epitaxially growing a second SiGe layer on top of a first SiGe layer, and epitaxially growing a first SiGe layer on top of a substrate in accordance with an embodiment of the present invention.

FIG. 1A depicts a top view of a semiconductor structure 100 with epitaxially growing a first SiGe layer 104 on top of a substrate 102, epitaxially growing a second SiGe layer 106 on top of a first SiGe layer 104, and epitaxially growing a third SiGe layer 108 on top of a second SiGe layer 106 in accordance with an embodiment of the present invention. As depicted, FIG. 1A, in a top view, shows a third SiGe layer 108 of the semiconductor structure 100.

Figure 1B:
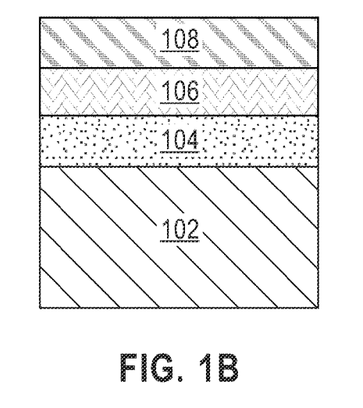
FIG. 1B depicts a cross-sectional view through X cross-section of a semiconductor structure with epitaxially growing a third SiGe layer on top of a second SiGe layer, epitaxially growing a second SiGe layer on top of a first SiGe layer, and epitaxially growing a first SiGe layer on top of a substrate in accordance with an embodiment of the present invention.

FIG. 1B depicts a cross-sectional view through X cross-section of a semiconductor structure 100 with epitaxially growing a third SiGe layer 108 on top of a second SiGe layer 106, epitaxially growing a second SiGe layer 106 on top of a first SiGe layer 104, and epitaxially growing a first SiGe layer 104 on top of a substrate 102 in accordance with an embodiment of the present invention. In an embodiment, substrate 102 may be a bulk semiconductor, a layered semiconductor substrate such as Si/SiGe, a silicon-on-insulator substrate (SOI), or a SiGe-on-insulator substrate (SGOI). The substrate 102 may include any semiconducting material, such as, for example, undoped silicon (Si), n-doped Si, p-doped Si, single crystal Si, polycrystalline Si, amorphous Si, germanium (Ge), SiGe, SiC, SiGeC, Ga, GaAs, InAs, InP, or any other III/V or II/VI compound semiconductors.

In an embodiment, the first SiGe layer 104 may be epitaxially grown on top of the substrate 102 by selective epitaxial growth in any suitable epitaxial deposition system, including, but not limited to, metal-organic chemical vapor deposition (MOCVD), atmospheric-pressure CVD (APCVD), low- (or reduced-) pressure CVD (LPCVD), ultra-high-vacuum CVD (UHCVD), molecular beam epitaxy (MBE), or atomic layer deposition (ALD). In an embodiment, the second SiGe layer 106 may be epitaxially grown on top of the first SiGe layer 104 by selective epitaxial growth in any suitable epitaxial deposition system, including, but not limited to, metal-organic chemical vapor deposition (MOCVD), atmospheric-pressure CVD (APCVD), low- (or reduced-) pressure CVD (LPCVD), ultra-high-vacuum CVD (UHCVD), molecular beam epitaxy (MBE), or atomic layer deposition (ALD). In an embodiment, the third SiGe layer 108 may be epitaxially grown on top of the second SiGe layer 106 by selective epitaxial growth in any suitable epitaxial deposition system, including, but not limited to, metal-organic chemical vapor deposition (MOCVD), atmospheric-pressure CVD (APCVD), low- (or reduced-) pressure CVD (LPCVD), ultra-high-vacuum CVD (UHCVD), molecular beam epitaxy (MBE), or atomic layer deposition (ALD). In an embodiment, the first SiGe layer 104, the second SiGe layer 106, and the third SiGe layer 108 may be compressively strained due to their crystalline lattices matching the underlying substrate 102.

In an embodiment, the first SiGe layer 104 may be 30-100 nm in vertical thickness. In an alternative embodiment, the first SiGe layer 104 may be any vertical thickness suitable for applications known in the art. In an embodiment, the second SiGe layer 106 may be 15-30 nm in vertical thickness. In an alternative embodiment, the second SiGe layer 106 may be any vertical thickness suitable for applications known in the art. In an embodiment, the third SiGe layer 108 may be 30-100 nm in vertical thickness. In an alternative embodiment, the third SiGe layer 108 may be any vertical thickness suitable for applications known in the art.

In a first embodiment, the first SiGe layer 104 and the third SiGe layer 108 may be 25% Ge. In other words, first SiGe layer 104 and the third SiGe layer 108 may be SiGe25. In an alternative embodiment, the first SiGe layer 104 and the third SiGe layer 108 may be any Ge % suitable for applications known in the art. In a first embodiment, the first SiGe layer 104 and the third SiGe layer 108 may comprise the same concentration of Ge. In an alternative embodiment, the first SiGe layer 104 and the third SiGe layer 108 may comprise different concentrations of Ge. For example, first SiGe layer 104 may be 25% Ge (SiGe25) and the third SiGe layer 108 may be 30% Ge (SiGe30). In an embodiment, the second SiGe layer 106 may be 50% Ge (SiGe50), 60% Ge (SiGe60), or any other % Ge suitable for applications known in the art. In an embodiment, the different % Ge in different SiGe layers provides etch selectivity among them.

Figure 2A:
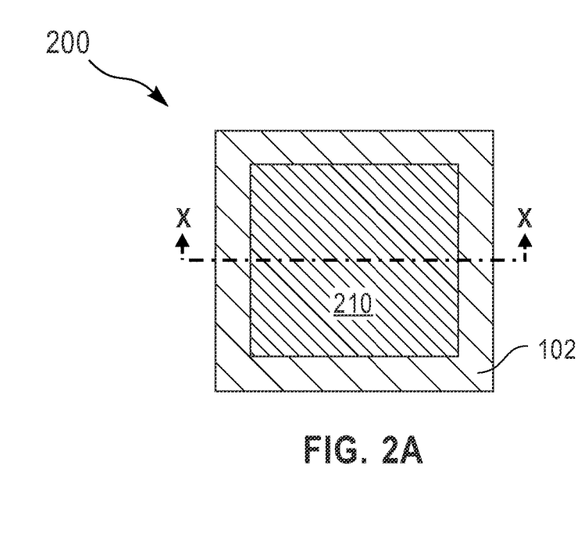
FIG. 2A depicts a top view of a semiconductor structure with deposition of a hardmask layer on top of the third SiGe layer in accordance with an embodiment of the present invention.
Figure 2B:
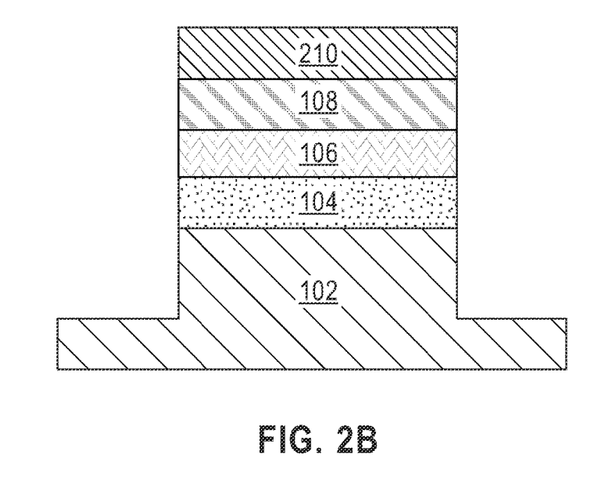
FIG. 2B depicts a cross-sectional view through X cross-section of a semiconductor structure with deposition of a hardmask layer on top of the third SiGe layer in accordance with an embodiment of the present invention.

FIG. 2A depicts a top view of a semiconductor structure 200 with deposition of a hardmask layer 210 on top of the third SiGe layer 108 in accordance with an embodiment of the present invention. In an embodiment, hardmask layer 210 may have a thickness of 20 nm to 60 nm although not limited to that range. In an embodiment, the hardmask layer 210 may be silicon oxide, silicon nitride (SiN), silicon carbon nitride (SiCN), or any other material known in the art. In an embodiment, the hardmask layer 210 may be patterned into a square as shown in FIGS. 2A and 2B. In an embodiment, the hardmask layer 210 may have an area of 100 nm×150 nm, 1000 nm×300 nm, or any area suitable for applications known in the art. For example, the area of the hardmask layer 210 may be suitable for any number of designs of transistors. In an embodiment, there may be any number of hardmask layer 210 forming any number of patterns that may be etched to form any number of stacks, discussed below. In an embodiment, the hardmask layer 210 may be a "soft" material, meaning it its Young's modulus is below 50 gigapascals (GPa). In one embodiment, hardmask layer 210 may be carbon-doped silicon oxide.

FIG. 2B depicts a cross-sectional view through X cross-section of a semiconductor structure 200 with deposition of a hardmask layer 210 on top of the third SiGe layer 108 in accordance with an embodiment of the present invention. In an embodiment, after deposition of the hardmask layer 210, as described above, the pattern is etched into substrate 102, first SiGe layer 104, second SiGe layer 106, and third SiGe layer 108 using a plasma etch process or any other known etching processes known in the art. After deposition of hardmask layer 210 and patterning, one or more stacks, as noted above, are made and substrate 102 that remains in the one or more stack may be 30 to 200 nm in height or any other height suitable for applications known in the art. As shown in FIGS. 2A and 2B, substrate 102 may remain below the patterned stack.

Figure 3A:
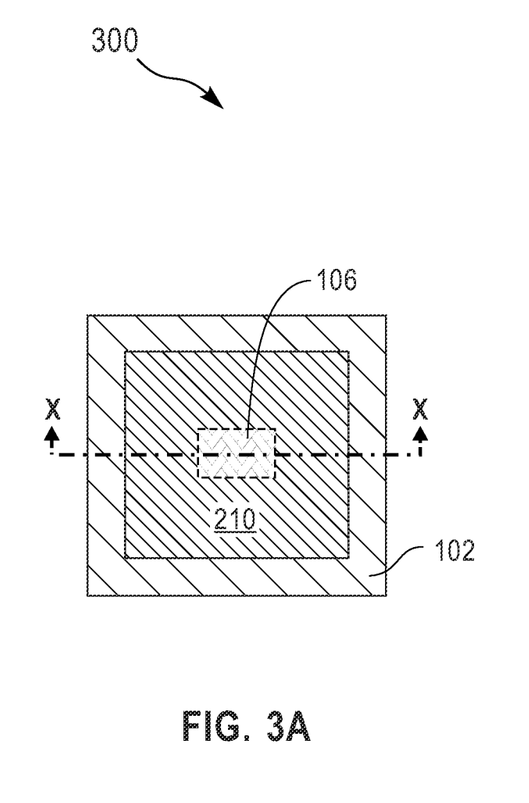
FIG. 3A depicts a top view of a semiconductor structure after the second SiGe layer being selectively undercut selective to the first SiGe layer, third SiGe layer, and substrate in accordance with an embodiment of the present invention.

FIG. 3A depicts a top view of a semiconductor structure 300 after the second SiGe layer 106 being undercut selective to the first SiGe layer 104, third SiGe layer 108, and substrate 102 in accordance with an embodiment of the present invention. As depicted, FIG. 3A, the second SiGe layer 106 has been selectively cut in both lateral directions, as shown by the dashed lines indicated the second SiGe layer 106 located below hardmask layer 210. After the selective undercut, the remaining lateral dimensions of the SiGe layer 106 may range from 5 nm to 30 nm. In an embodiment, the lateral dimensions may be the same (5 nm×5 nm). In an alternative embodiment, the lateral dimensions may be different (5 nm×30 nm).

Figure 3B:
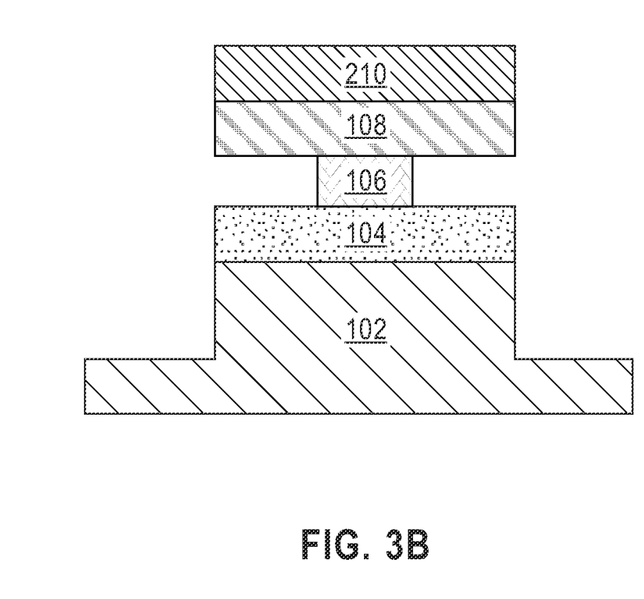
FIG. 3B depicts a cross-sectional view through X cross-section of a semiconductor structure after the second SiGe layer being selectively undercut selective to the first SiGe layer, third SiGe layer, and substrate in accordance with an embodiment of the present invention.

FIG. 3B depicts a cross-sectional view through X cross-section of a semiconductor structure 300 after the second SiGe layer 106 being selectively undercut selective to the first SiGe layer 104, third SiGe layer 108r, and substrate 102 in accordance with an embodiment of the present invention. As depicted, FIG. 3B the second SiGe layer 106 has been selectively undercut. In an embodiment, the second SiGe layer 106 may selectively undercut using a wet etch process containing a mix of ammonia and hydrogen peroxide by controlling the concentration of each species, temperature, and etch time. In an alternative embodiment, the second SiGe layer 106 may selectively undercut using a gas phase etch process containing hydrogen chloride with any suitable pressure, temperature, and etch time. In yet another alternative embodiment, the second SiGe layer 106 may be selectively undercut using any technique known in the art. In an embodiment, the remaining hardmask 210 on top of the third SiGe layer 108 is removed.

After the selective undercut of the second SiGe layer 106, the first SiGe layer 104 is compressively strained as it is anchored to substrate 102. After the selective undercut of the second SiGe layer 106, the third SiGe layer 108 is largely relaxed elastically relative to the first SiGe layer 104 due to elastic relaxation. In an embodiment, the remaining hardmask layer 210 on top of the third SiGe layer 108 is removed to allow further relaxation of the third SiGe layer 108. In an embodiment, the hardmask layer 210 comprise a soft material so that the third SiGe layer 108 can relax without being hindered by the remaining hardmask 210.

Figure 4A:
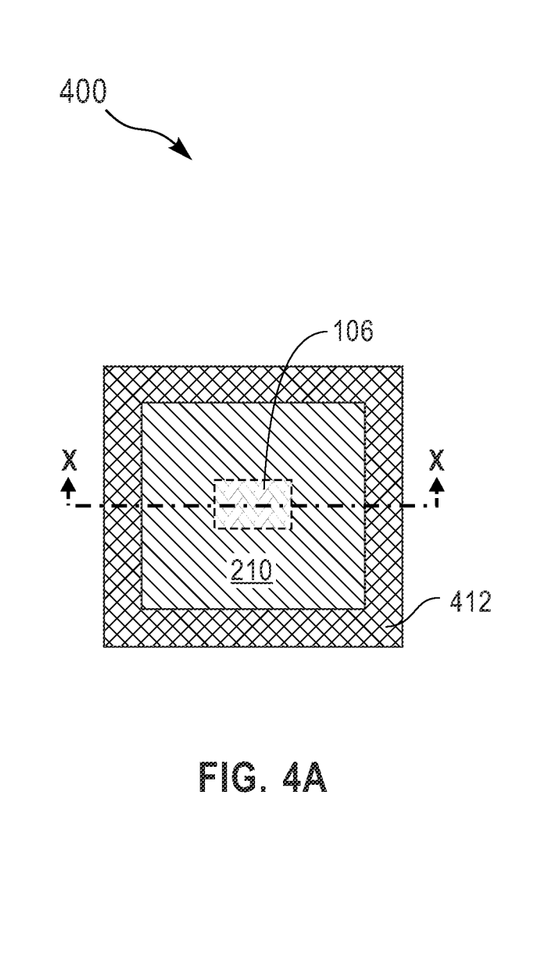
FIG. 4A depicts a top view of a semiconductor structure after a liner is deposited upon the semiconductor structure and a first dielectric layer is filled within gaps of the semiconductor structure in accordance with an embodiment of the present invention.

FIG. 4A depicts a top view of a semiconductor structure 400 after a liner 411 is deposited upon the semiconductor structure 400 and first dielectric layer 412 is filled within gaps of the semiconductor structure 400 in accordance with an embodiment of the present invention. As depicted, FIG. 4A shows first dielectric layer 412 covering substrate 102 and surrounding hardmask layer 210.

Figure 4B:
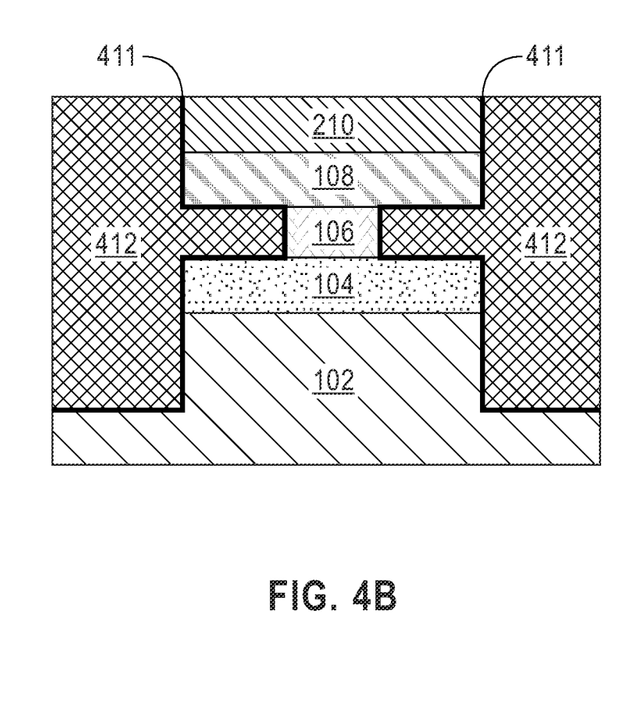
FIG. 4B depicts a cross-sectional view through X cross-section of a semiconductor structure after a liner is deposited upon the semiconductor structure and first dielectric layer is filled within gaps of the semiconductor structure in accordance with an embodiment of the present invention.

FIG. 4B depicts a cross-sectional view through X cross-section of a semiconductor structure 400 after a liner 411 is deposited upon the semiconductor structure 400 and first dielectric layer 412 is filled within gaps of the semiconductor structure 400 in accordance with an embodiment of the present invention. As depicted, FIG. 4B includes first dielectric layer 412 and liner 411. In an embodiment, first dielectric layer 412 may be made of a single dielectric materials or multiple dielectric materials (e.g., SiOC, SiON, or any other dielectric material containing elements Si, O, and C). In an embodiment, liner 411 may be made of SiN, or any other known liner material. In an embedment, the liner is formed between the first dielectric material 412 and substrate 102, first SiGe layer 104, second SiGe layer 106, third SiGe layer 108, and hardmask layer 210. In an embodiment, first dielectric layer 412 may be filled within the gaps of semiconductor structure 400 using known method of sidewall spacer formation known in the art, including but not limited to ALD. In an embodiment, the first dielectric layer 412 matches the height of hardmask layer 210 using CMP or any other processes known in the art.

Figure 5A:
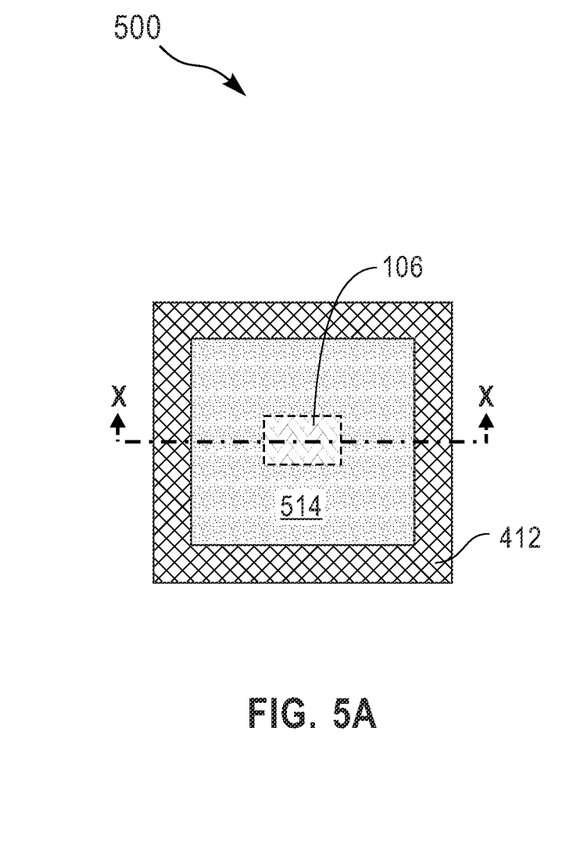
FIG. 5A depicts a top view of a semiconductor structure after selectively removing the hardmask layer and epitaxially growing a fourth semiconductor layer on top of the second SiGe layer in accordance with an embodiment of the present invention.

FIG. 5A depicts a top view of a semiconductor structure 500 after selectively removing the hardmask layer 210 and epitaxially growing a fourth semiconductor layer 514 on top of the second SiGe layer 108 in accordance with an embodiment of the present invention. As depicted, FIG. 5A includes a fourth semiconductor layer 514 epitaxially grown on top of the second SiGe layer 108 between liner 411 found on the edges of the first dielectric layer 412. As noted above, hardmask layer 210 may be removed using any process known in the art, including etching and/or CMP. As noted above, the fourth semiconductor layer 514 is done via selective epitaxial growth in any suitable epitaxial deposition system noted above or known in the art.

Figure 5B:
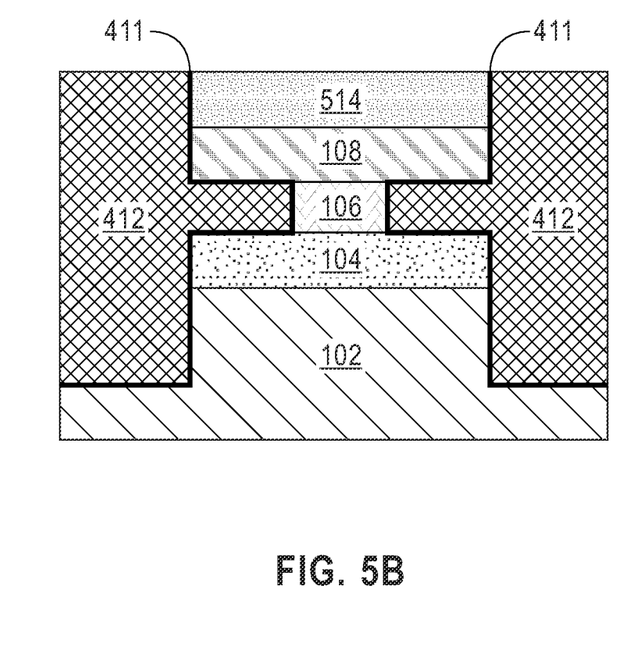
FIG. 5B depicts a cross-sectional view through X cross-section of a semiconductor structure after selectively removing the hardmask layer and epitaxially growing a fourth semiconductor layer on top of the second SiGe layer in accordance with an embodiment of the present invention.

FIG. 5B depicts a cross-sectional view through X cross-section of a semiconductor structure 500 after selectively removing the hardmask layer 210 and epitaxially growing a fourth semiconductor layer 514 on top of the second SiGe layer 108 in accordance with an embodiment of the present invention. As depicted, FIG. 5B includes a fourth semiconductor layer 514 epitaxially grown on top of the second SiGe layer 108 between liner 411 found on the edges of the first dielectric layer 412. In an embodiment, the lattice constant of the fourth semiconductor layer 514 is smaller than that of the underlying second SiGe layer 108 causing the fourth semiconductor layer to be tensely strained. In an embodiment, the fourth semiconductor layer 514 comprises solely Si. In an alternative embodiment, the fourth semiconductor layer 514 may be SiGe with 10% Ge or any other % Ge (lower than % Ge in the third SiGe layer 108) that creates a tensely strained fourth semiconductor layer 514.

Figure 6A:
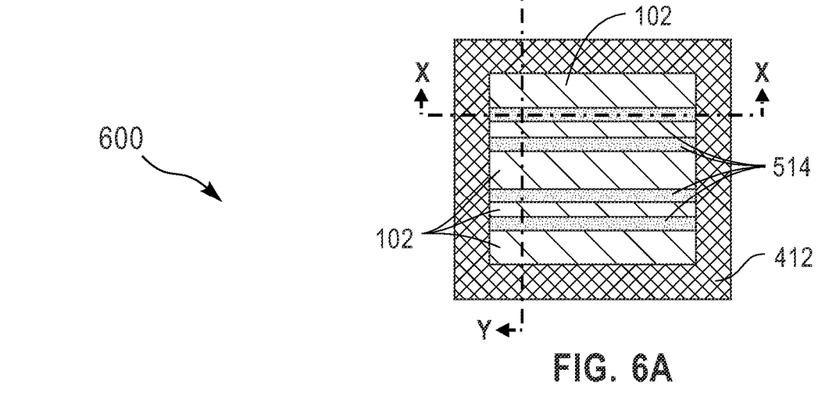
FIG. 6A depicts a top view of a semiconductor structure after patterning to form four fins in accordance with an embodiment of the present invention.

FIG. 6A depicts a top view of a semiconductor structure 600 after patterning to form four fins 615 in accordance with an embodiment of the present invention. As depicted, FIG. 6A. the semiconductor structure 600 has been patterned to form four fins 615. In an embodiment, the patterning may form the four fins 615 shown in FIG. 6A. In an alternative embodiment, the patterning may form any number of fins 615 suitable for applications known in the art. In an embodiment, the patterning can be done using semiconductor lithography followed by etching, as described above, or any other patterning process known in the art. As noted above, fin 615 is tensely strained at the top and compressively strained at the bottom. As shown in FIG. 6A, an outer layer of the first dielectric material 412 surround the space surrounding fins 615 and the first dielectric material 412 connects to each end of each fins 615.

Figure 6B:
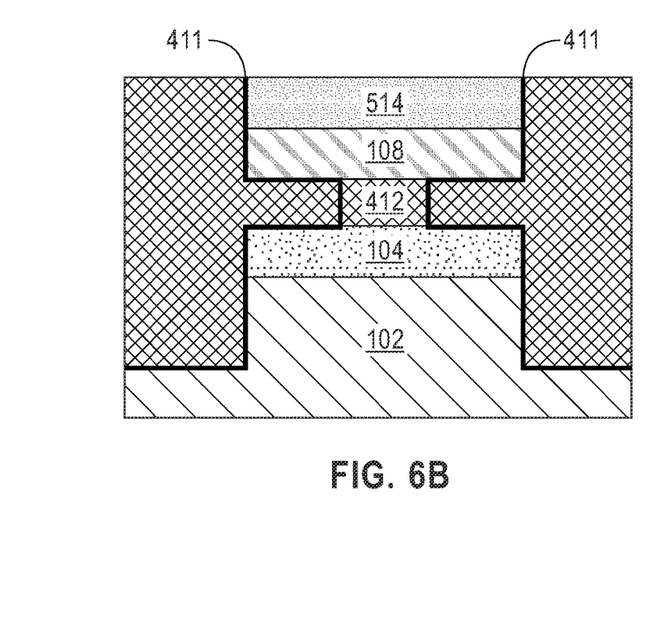
FIG. 6B depicts a cross-sectional view through X cross-section of a semiconductor structure after patterning to form four fins in accordance with an embodiment of the present invention.
Figure 6C:
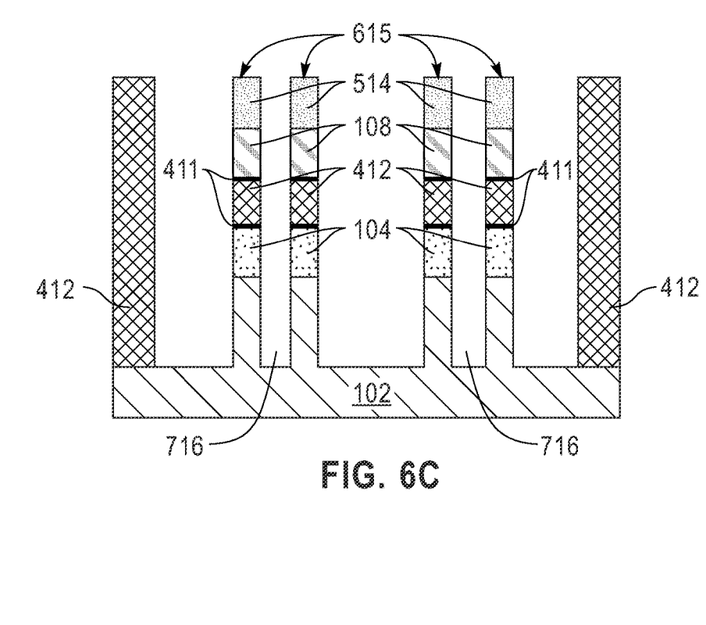
FIG. 6C depicts a cross-sectional view through Y cross-section of a semiconductor structure after patterning to form four fins in accordance with an embodiment of the present invention.

FIG. 6B depicts a cross-sectional view through X cross-section of a semiconductor structure 600 after patterning to form four fins 615 in accordance with an embodiment of the present invention. FIG. 6C depicts a cross-sectional view through Y cross-section of a semiconductor structure 600 after patterning to form four fins 615 in accordance with an embodiment of the present invention. As noted above, and depicted again in FIG. 6C, an outer layer of dielectric material 412 surround the space surrounding fins 615 and dielectric material 412 connects to each end of each fins 615.

Figure 7A:
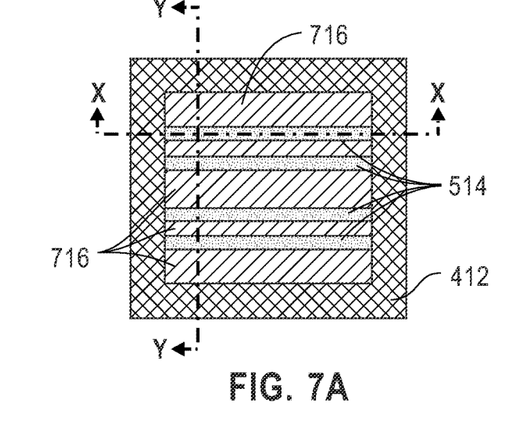
FIG. 7A depicts a top view of a semiconductor structure after depositing a second dielectric layer within the recess of the semiconductor structure to cover at least the substrate, first SiGe layer, and part of the first dielectric layer in accordance with an embodiment of the present invention.
Figure 7B:
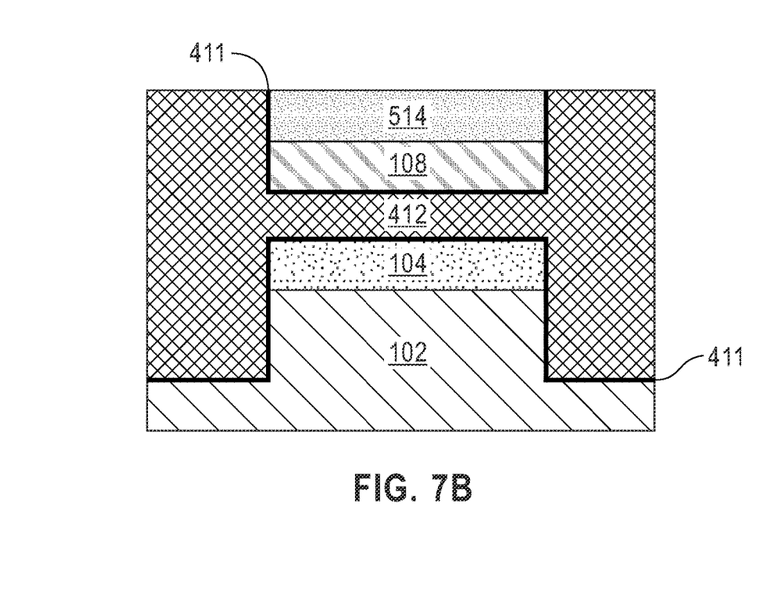
FIG. 7B depicts a cross-sectional view through X cross-section of a semiconductor structure after depositing a second dielectric layer within the recess of the semiconductor structure to cover at least the substrate, first SiGe layer, and part of the first dielectric layer in accordance with an embodiment of the present invention.
Figure 7C:
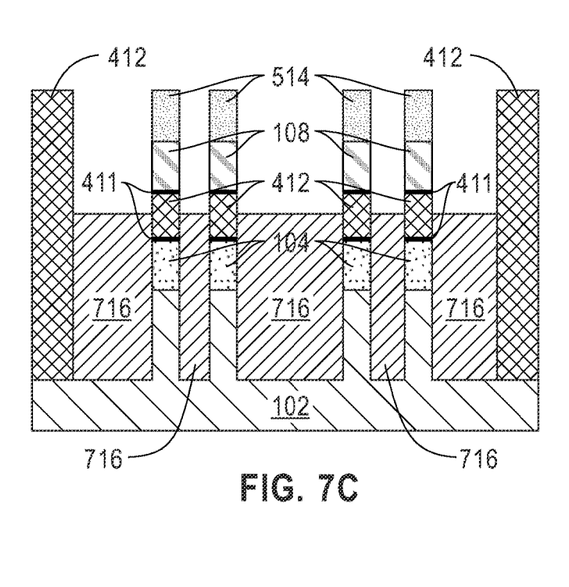
FIG. 7C depicts a cross-sectional view through Y cross-section of a semiconductor structure after depositing a second dielectric layer within the recess of the semiconductor structure to cover at least the substrate, first SiGe layer, and part of the first dielectric layer in accordance with an embodiment of the present invention.

FIG. 7A depicts a top view of a semiconductor structure 700 after depositing a second dielectric layer 716 within the recess of the semiconductor structure 700 to cover at least the substrate 102, first SiGe layer 104, and part of the first dielectric layer 412 in accordance with an embodiment of the present invention. FIG. 7B depicts a cross-sectional view through X cross-section of a semiconductor structure 700 after depositing a second dielectric layer 716 within the recess of the semiconductor structure 700 to cover at least the substrate 102, first SiGe layer 104, and part of the first dielectric layer 412 in accordance with an embodiment of the present invention. FIG. 7C depicts a cross-sectional view through Y cross-section of a semiconductor structure 700 after depositing a second dielectric layer 716 within the recess of the semiconductor structure 700 to cover at least the substrate 102, first SiGe layer 104, and part of the first dielectric layer 412 in accordance with an embodiment of the present invention.

As depicted in FIGS. 7A, 7B, and 7C, a second dielectric layer 716 is deposited into the recess to fill the recess and cover at least the substrate 102, the first SiGe layer 104, and part of the first dielectric layer 412. As depicted in FIG. 7C, the second SiGe layer 108 and fourth semiconductor layer 514 remain exposed. In an embodiment, the second dielectric layer 716 may be an oxide material, such as a silicon oxide (e.g., $SiO_2$ or $SiO_x$) material produced from silane ($SiH_4$) or tetraethyl orthosilicate, also known as tetraethoxysilane (TEOS) as precursors for forming an oxide, a PECVD "flowable" oxide-like material, such as SiCOH, flowable SiCOH, oxynitride (SiON) or a nitride (SiN), or a spin-on-glass, but in not limited to these dielectric materials. In an embodiment, the second dielectric layer 716 may be another dielectric material, including but not limited to silicon nitride (SiN), silicon carbide (SiC), silicon oxynitride (SiON), carbon-doped silicon oxide (SiOC), fluorine-doped silicon oxide (SiO:F), silicon-carbon-nitride (SiCN), boron nitride (BN), silicon boron nitride (SiBN), silicoboron carbonitride (SiBCN), silicon oxycabonitride (SiOCN), silicon oxide, and combinations thereof.

In an embodiment, the second dielectric layer 716 may be a be a low-k material having a dielectric constant less than about 7, less than 5, or less than 3.9. The second dielectric layer 716 may be formed by any suitable techniques such as deposition followed by directional etch. In an embodiment, Deposition of the second dielectric layer 716 may include but is not limited to, atomic layer deposition (ALD), chemical vapor deposition (CVD), spin-on process, etc. In some embodiments, a thermal anneal can be performed to improve the quality of the second dielectric layer 716 after deposition.

Figure 8A:
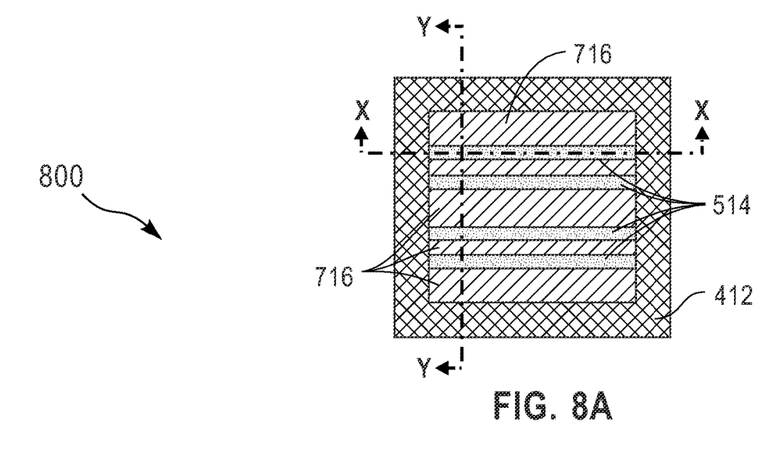
FIG. 8A depicts a top view of a semiconductor structure after removal of the second SiGe layer in accordance with an embodiment of the present invention.
Figure 8B:
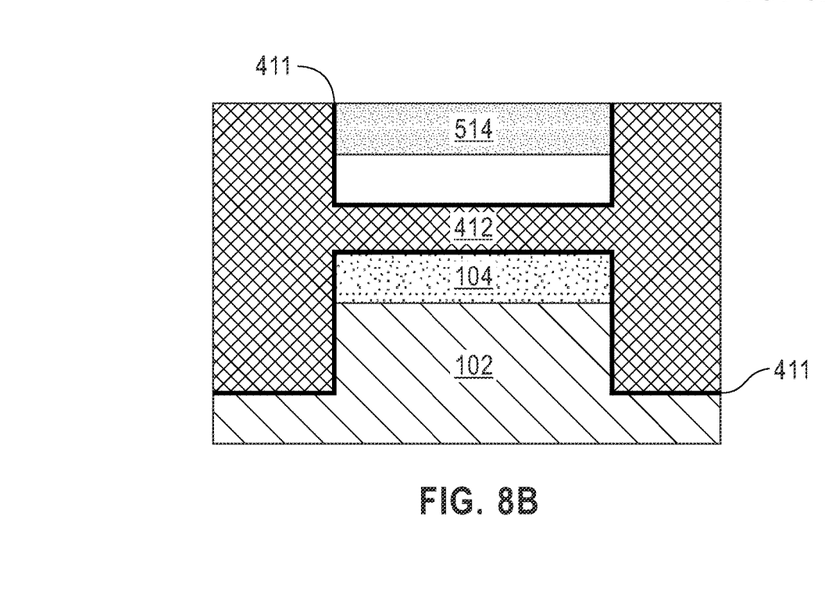
FIG. 8B depicts a cross-sectional view through X cross-section of a semiconductor structure after removal of the second SiGe layer in accordance with an embodiment of the present invention.
Figure 8C:
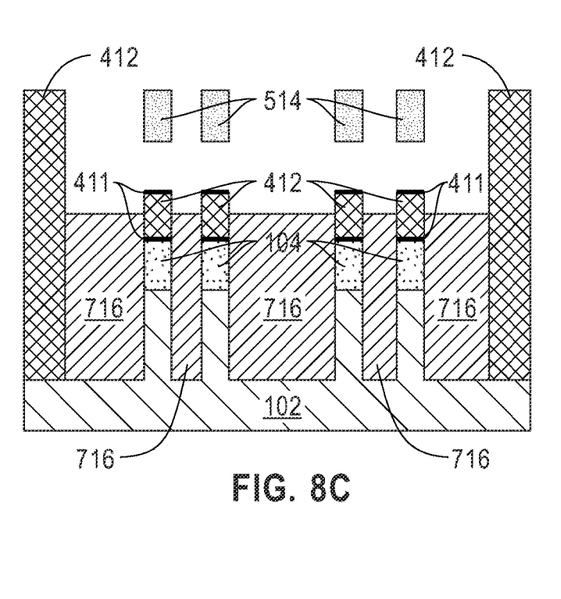
FIG. 8C depicts a cross-sectional view through Y cross-section of a semiconductor structure after removal of the second SiGe layer in accordance with an embodiment of the present invention.

FIG. 8A depicts a top view of a semiconductor structure 800 after removal of the second SiGe layer 108 in accordance with an embodiment of the present invention. FIG. 8B depicts a cross-sectional view through X cross-section of a semiconductor structure 800 after removal of the second SiGe layer 108 in accordance with an embodiment of the present invention. FIG. 8C depicts a cross-sectional view through Y cross-section of a semiconductor structure 800 after removal of the second SiGe layer 108 in accordance with an embodiment of the present invention. In an embodiment the second SiGe layer 108 may be removed by using a wet etch process containing a mix of ammonia and hydrogen peroxide by controlling the concentration of each species, temperature, and etch time. In an alternative embodiment, the second SiGe layer 108 may be removed using a gas phase etch process containing hydrogen chloride with any suitable pressure, temperature, and etch time. After removal of the second SiGe layer 108, as shown in FIGS. 8A and 8C the fourth semiconductor 514 layer is exposed with the exception to its connection at the end of each fin 615 which remains connected to the first dielectric layer 412.

Figure 9A:
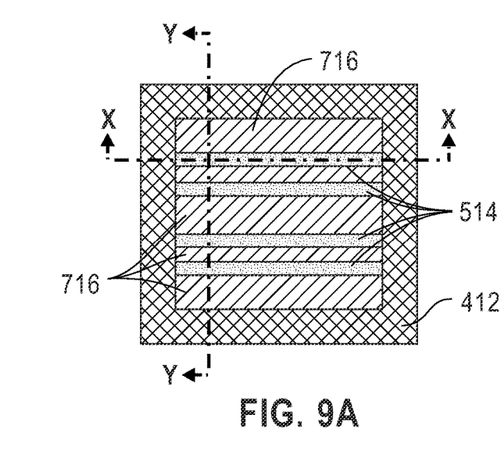
FIG. 9A depicts a top view of a semiconductor structure after a third dielectric layer is deposited on top of the second dielectric layer up to at least the bottom of the fourth semiconductor layer and then removal of the third dielectric layer and the second dielectric layer at least below the top of the substrate in accordance with an embodiment of the present invention.
Figure 9B:
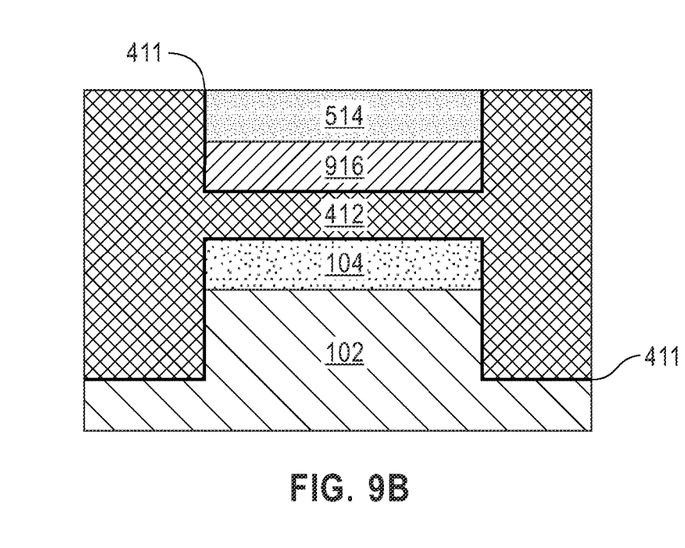
FIG. 9B depicts a cross-sectional view through X cross-section of a semiconductor structure after a third dielectric layer is deposited on top of the second dielectric layer up to at least the bottom of the fourth semiconductor layer and then removal of the third dielectric layer and the second dielectric layer at least below the top of the substrate in accordance with an embodiment of the present invention.
Figure 9C:
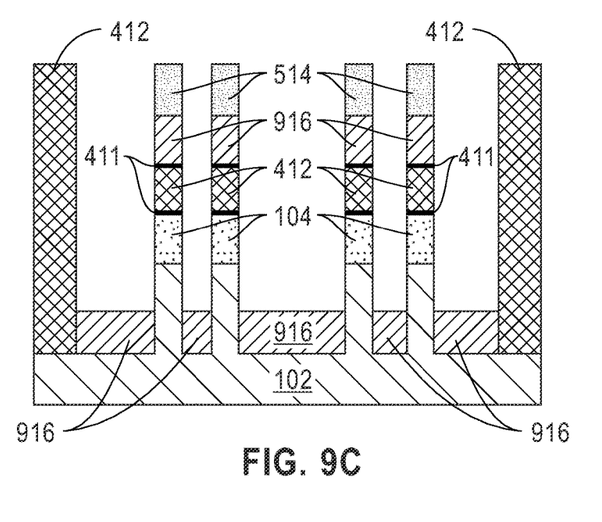
FIG. 9C depicts a cross-sectional view through Y cross-section of a semiconductor structure after a third dielectric layer is deposited on top of the second dielectric layer up to at least the bottom of the fourth semiconductor layer and then removal of the third dielectric layer and the second dielectric layer at least below the top of the substrate in accordance with an embodiment of the present invention.

FIG. 9A depicts a top view of a semiconductor structure 900 after a third dielectric layer 916 is deposited on top of the second dielectric layer 716 up to at least the bottom of the fourth semiconductor layer 514 and then removal of the third dielectric layer 916 and the second dielectric layer 715 at least below the top of the substrate 102 in accordance with an embodiment of the present invention. FIG. 9B depicts a cross-sectional view through X cross-section of a semiconductor structure 900 after a third dielectric layer 916 is deposited on top of the second dielectric layer 716 up to at least the bottom of the fourth semiconductor layer 514 and then removal of the third dielectric layer 916 and the second dielectric layer 715 at least below the top of the substrate 102 in accordance with an embodiment of the present invention. FIG. 9C depicts a cross-sectional view through Y cross-section of a semiconductor structure 900 after a third dielectric layer 916 is deposited on top of the second dielectric layer 716 up to at least the bottom of the fourth semiconductor layer 514 and then removal of the third dielectric layer 916 and the second dielectric layer 715 at least below the top of the substrate 102 in accordance with an embodiment of the present invention.

In an embodiment, the third dielectric layer 916 may be an oxide material, such as a silicon oxide (e.g., $SiO_2$ or $SiO_x$) material produced from silane ($SiH_4$) or tetraethyl orthosilicate, also known as tetraethoxysilane (TEOS) as precursors for forming an oxide, a PECVD "flowable" oxide-like material, such as SiCOH, flowable SiCOH, SOD, oxynitride (SiON) or a nitride (SiN), or a spin-on-glass, but in not limited to these dielectric materials. In an embodiment, the third dielectric layer 916 may be another dielectric material, including but not limited to silicon nitride (SiN), silicon carbide (SiC), silicon oxynitride (SiON), carbon-doped silicon oxide (SiOC), fluorine-doped silicon oxide (SiO:F), silicon-carbon-nitride (SiCN), boron nitride (BN), silicon boron nitride (SiBN), silicoboron carbonitride (SiBCN), silicon oxycabonitride (SiOCN), silicon oxide, and combinations thereof. In an embodiment, the third dielectric layer 916 may be a be a low-k material having a dielectric constant less than about 7, less than 5, or less than 3.9.

In an embodiment, the third dielectric layer 916 is deposited on top of the second dielectric layer 716 up to a level at least above the bottom of the fourth semiconductor layer 514. As shown in FIGS. 9B and 9C, the third dielectric layer 916 is deposited between the first dielectric layer 412 and fourth semiconductor layer 514. Afterwards, the third dielectric layer 916 is removed down to a level at least below the top of the substrate 102. As shown in FIGS. 9B and 9C, the third dielectric layer 916 remains between the first dielectric layer 412 and fourth semiconductor layer 514 as part of fins 615.

The third dielectric layer 916 may be formed by any suitable techniques such as deposition followed by directional etch. In an embodiment, Deposition of the third dielectric layer 916 may include but is not limited to, atomic layer deposition (ALD), chemical vapor deposition (CVD), spin-on process, etc. In some embodiments, a thermal anneal can be performed to improve the quality of the second dielectric layer 716 after deposition.

Figure 10A:
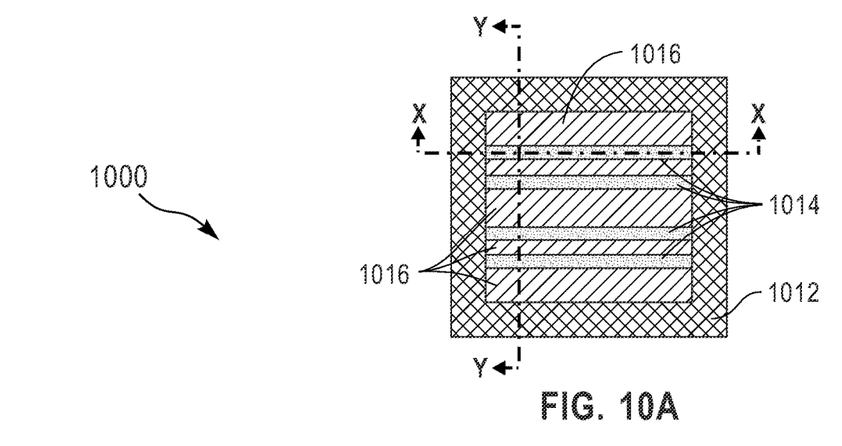
FIG. 10A depicts a top view of a semiconductor structure that may be applied to nanosheet technology in accordance with a second embodiment of the present invention.

FIG. 10A depicts a top view of a semiconductor structure 1000 that may be applied to nanosheet technology in accordance with a second embodiment of the present invention. As shown in the top view of the semiconductor structure 1000, the final structure, from a top view, is substantially similar to the final structure depicted in FIG. 9A as created in the first embodiment. In a second embodiment, first dielectric layer 1012 is substantially similar to first dielectric layer 412. In a second embodiment, the fourth semiconductor layer 1014 is substantially similar to the fourth semiconductor layer 514. In a second embodiment, the second dielectric layer 716 is substantially similar to the second dielectric layer 1016.

Figure 10B:
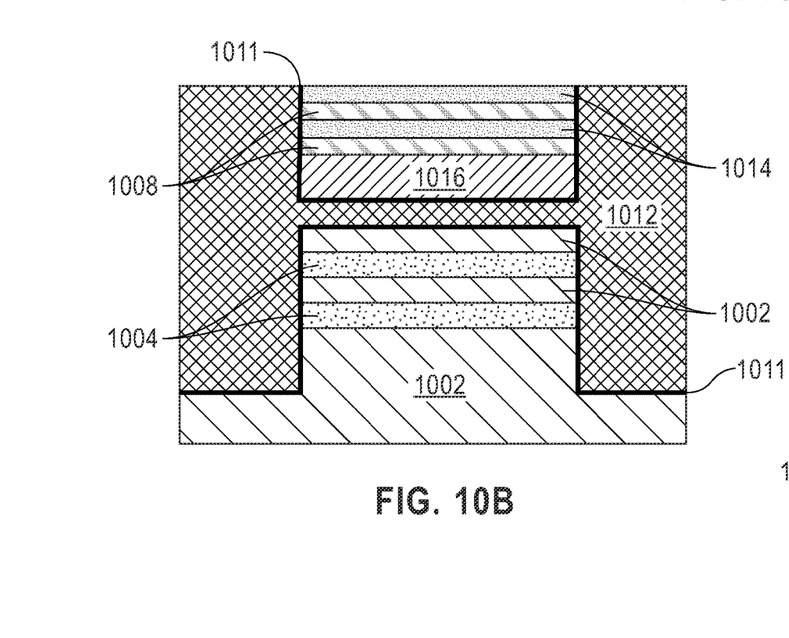
FIG. 10B depicts a cross-sectional view through X cross-section of a semiconductor structure that may be applied to nanosheet technology in accordance with a second embodiment of the present invention.

FIG. 10B depicts a cross-sectional view through X cross-section of a semiconductor structure 1000 that may be applied to nanosheet technology in accordance with a second embodiment of the present invention. As shown in the cross-section view through X cross-section of a semiconductor structure 1000, the final structure, from a cross-section view through X cross-section is substantially similar to the final structure depicted in FIG. 9B as created in the first embodiment with one substantial difference. As shown in FIG. 10B, there are two alternating layers of substrate 1002 and first SiGe layer 1004 on top of the base substrate 1002, instead of the single layer of substrate 102 and first SiGe layer 104 on top of the base substrate 102, as shown in in FIG. 9B. In an alternative embodiment, there may be any number of alternating layers of substrate 1002 and first SiGe layer 1004 on top of the base substrate 1002. As shown in FIG. 10B, there are two alternating layers of third SiGe layer 1008 and fourth semiconductor layer 1014. In an alternative embodiment, there may be any number of alternating layers of third SiGe layer 1008 and fourth semiconductor layer 1014.

In a second embodiment, substrate 1002 is substantially similar to substrate 102. In a second embodiment, first SiGe layer 1004 is substantially similar to first SiGe layer 104. In a second embodiment, third SiGe layer 1008 is substantially similar to third SiGe layer 108. In a second embodiment, liner 1011 is substantially similar to liner 411. In a second embodiment, first dielectric layer 1012 is substantially similar to first dielectric layer 412. In a second embodiment, fourth semiconductor layer 1014 is substantially similar to fourth semiconductor layer 514. In a second embodiment, third dielectric layer 1016 is substantially similar to third dielectric layer 916.

Figure 10C:
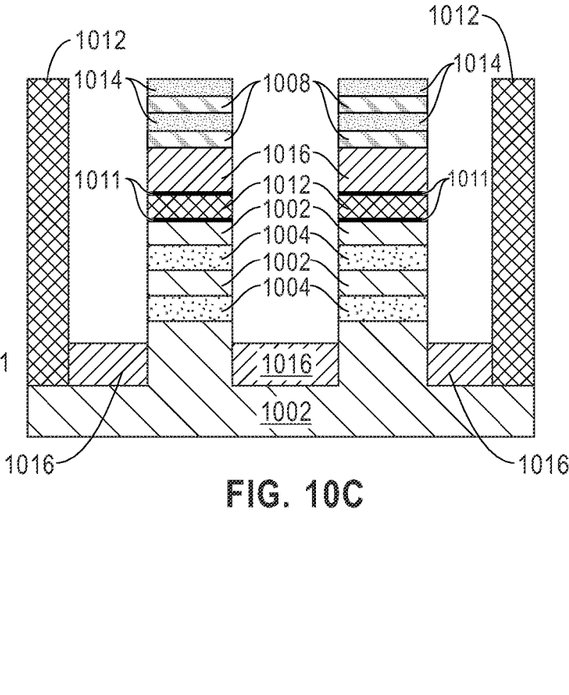
FIG. 10C depicts a cross-sectional view through Y cross-section of a semiconductor structure that may be applied to nanosheet technology in accordance with a second embodiment of the present invention.

FIG. 10C depicts a cross-sectional view through Y cross-section of a semiconductor structure 1000 that may be applied to nanosheet technology in accordance with a second embodiment of the present invention. As shown in the cross-section view through Y cross-section of a semiconductor structure 1000, the final structure, from a cross-section view through Y cross-section is substantially similar to the final structure depicted in FIG. 9C as created in the first embodiment with one substantial difference. As shown in FIG. 10C, there are two alternating layers of substrate 1002 and first SiGe layer 1004 on top of the base substrate 1002, instead of the single layer of substrate 102 and first SiGe layer 104 on top of the base substrate 102, as shown in in FIG. 9C. In an alternative embodiment, there may be any number of alternating layers of substrate 1002 and first SiGe layer 1004 on top of the base substrate 1002. As shown in FIG. 10C, there are two alternating layers of third SiGe layer 1008 and fourth semiconductor layer 1014. In an alternative embodiment, there may be any number of alternating layers of third SiGe layer 1008 and fourth semiconductor layer 1014.

In the second embodiment, the alternating layers of first SiGe layer 1004 are compressively strained. In the second embodiment, the alternating layers of third SiGe layer 1008 are relaxed. In the second embodiment, the alternating layers of fourth semiconductor layer 1014 are tensely strained. In other words, the first SiGe layer 1004 on top of the base substrate 1002 are compressively strained, and fourth semiconductor layer 1014 are tensely strained.

Figure 11:
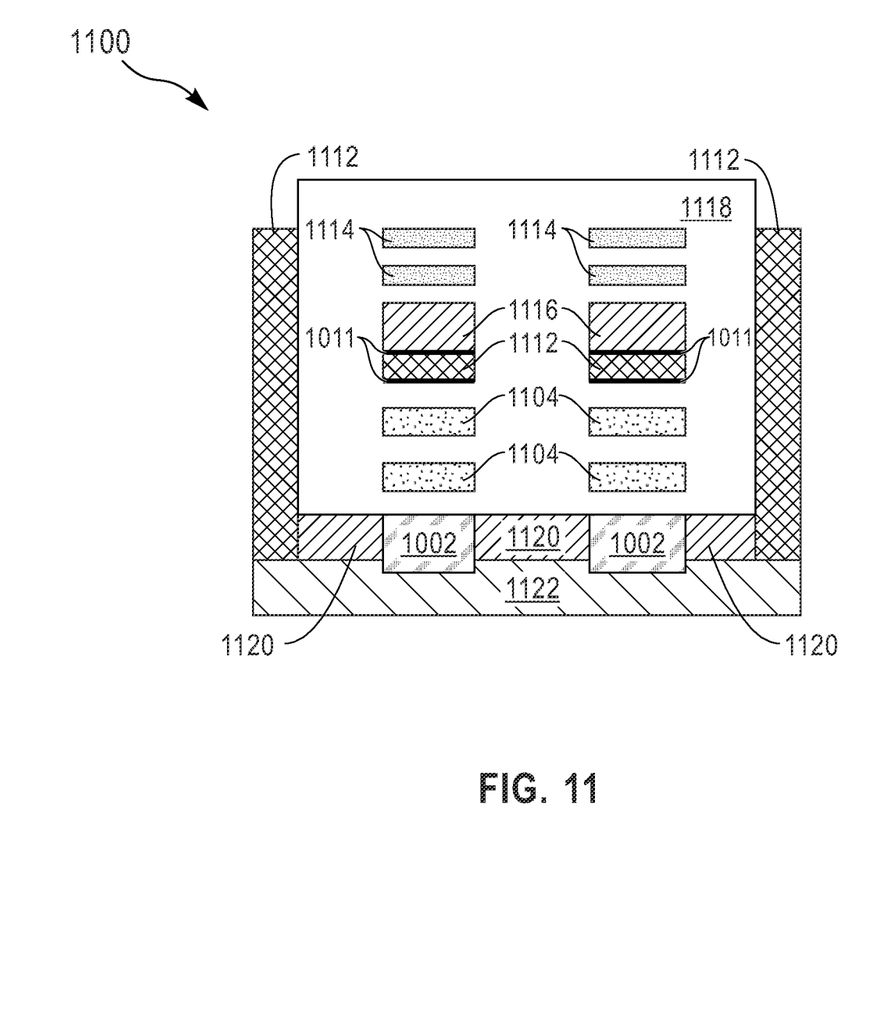
FIG. 11 depicts a cross-sectional view of a nanosheet CMOS in accordance with a third embodiment of the present invention.

FIG. 11 depicts a cross-sectional view of a nanosheet CMOS 1100 in accordance with a third embodiment of the present invention. In a third embodiment, substrate 1102 is substantially similar to substrate 102. In a third embodiment, first SiGe layer 1104 is substantially similar to first SiGe layer 104. In a third embodiment, first dielectric layer 1112 is substantially similar to first dielectric layer 412. In a third embodiment, fourth semiconductor layer 1114 is substantially similar to fourth semiconductor layer 514. In a third embodiment, third dielectric layer 1116 is substantially similar to third dielectric layer 916.

As depicted in FIG. 11, the third SiGe layers 1008 and layers of substrate 1002 on top of the base substrate 1002 in the second embodiment have been removed using processes known in the art. Shallow trench isolation (STI) 1120 has been formed between each of the stacks and the remaining first dielectric layer 1112 on the outside of the nanosheet CMOS 1100 in order to reduce electric current leakage using processes known in the art. In an embodiment, nanosheet CMOS 110 includes bottom dielectric isolation (BDI) 1122 at the bottom of each fin and connected to the remaining substrate 1102 using processes known in the art. In an embodiment, and as depicted in FIG. 11, a high-k gate dielectric and metal gate layer 1118 is deposited on top of the STI 1120 and BDI 1122 between the outer first dielectric layer 1112 and around the first SiGe layer 1104, the isolated first dielectric layer 1112, the fourth semiconductor layer 1114, and the third dielectric layer 1116. Although not shown, the transistors shown in FIG. 1-11 can further comprise other device structures such as source/drains, contacts, wires.

While the invention has been shown and described with reference to certain exemplary embodiments thereof, it will be understood by those skilled in the art that various changes in form and details may be made therein without departing from the spirit and scope of the present invention as defined by the appended claims and their equivalents.

The descriptions of the various embodiments of the present invention have been presented for purposes of illustration but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the one or more embodiment, the practical application or technical improvement over technologies found in the marketplace, or to enable others of ordinary skill in the art to understand the embodiments disclosed herein.

What is claimed is:

1. A semiconductor structure comprising:
    a dielectric layer on top of a first semiconductor stack, wherein the first semiconductor stack is compressively strained, and wherein the first semiconductor stack comprises Silicon Germanium (SiGe); and
    a second semiconductor stack on top of the dielectric layer, wherein the second semiconductor stack is tensely strained.

2. The semiconductor structure of claim 1, wherein the second semiconductor stack comprises Silicon.

3. The semiconductor structure of claim 1, wherein the first semiconductor stack comprises two or more alternating layers of Silicon Germanium (SiGe) and a substrate.

4. The semiconductor structure of claim 1, wherein the second semiconductor stack comprises two or more alternating layers of a Silicon Germanium (SiGe) layer and a Silicon layer.

5. The semiconductor structure of claim 1, wherein a first liner is located between and in contact with the dielectric layer and the first semiconductor stack and wherein a second liner is located between and in contact with the dielectric layer and the second semiconductor stack.

6. A semiconductor structure comprising:
    a first silicon germanium (SiGe) layer on top of and in contact with a substrate;
    a first liner layer on top of and in contact with the first SiGe layer;
    a first dielectric layer on top of and in contact with the first liner layer;
    a second liner layer on top of and in contact with the first dielectric layer;
    a second dielectric layer on top of and in contact with the second liner layer; and
    a second silicon germanium (SiGe) layer on top of and in contact with the second dielectric layer.

7. The semiconductor structure of claim 6, further comprising:
    a third dielectric layer surrounding and in contact with at least a portion of the substrate.

8. The semiconductor structure of claim 6, wherein the first SiGe layer is compressively strained.

9. The semiconductor structure of claim 6, wherein the second SiGe layer is relaxed.

10. The semiconductor structure of claim 6, wherein the first SiGe layer is 25% Germanium.

* * * * *